United States Patent [19]

Schairer et al.

[11] Patent Number: 4,794,610

[45] Date of Patent: Dec. 27, 1988

[54] HETEROSTRUCTURE SEMICONDUCTOR LASER DIODE

[75] Inventors: Werner Schairer, Weinsberg; Jochen Gerner, Wiesloch, both of Fed. Rep. of Germany

[73] Assignee: TELEFUNKEN electronic GmbH, Heilbronn, Fed. Rep. of Germany

[21] Appl. No.: 13,436

[22] Filed: Feb. 11, 1987

[30] Foreign Application Priority Data

Feb. 12, 1986 [DE] Fed. Rep. of Germany ....... 3604294

[51] Int. Cl.$^4$ .............................................. H01S 3/19
[52] U.S. Cl. ...................................... 372/45; 372/46; 372/49
[58] Field of Search ...................... 372/44, 45, 46, 49

[56] References Cited

U.S. PATENT DOCUMENTS 4,371,966 2/1983 Seifres et al. .......................... 372/45
4,506,366 3/1985 Chinone et al. ...................... 372/45

FOREIGN PATENT DOCUMENTS 95826 11/1983 European Pat. Off. .
115390 1/1984 European Pat. Off. .
0161691 8/1985 Japan .................................... 372/46

Primary Examiner—William L. Sikes
Assistant Examiner—Georgia Y. Epps
Attorney, Agent, or Firm—Spencer & Frank

[57] ABSTRACT

The invention relates to a heterostructure semiconductor laser diode with a layer sequence formed on a substrate, wherein a laser-active zone is arranged between layers of respectively opposite conductivity types, wherein an additional layer having a cover layer disposed thereon, and both of the same conductivity type as the substrate, are formed on the side of the layer sequence facing away from the substrate, and wherein a semiconductor area doped oppositely to the cover layer is produced by diffusion in the cover layer and penetrates, in a strip-shaped zone extending perpendicularly to the exit surface of the laser radiation in the area of the plane of symmetry below a v-groove-shaped recess, the boundary plane between the cover layer and the adjacent additional layer and extends into but not through the layer arranged thereunder, whereby the current flowing in the forward direction of the semiconductor laser diode is confined to a narrow strip-shaped area of the laser-active layer. The amplifying area of the laser-active is made significantly shorter in its length-wise dimensions than the resonator length of the semiconductor laser diode by the laser-active layer extending in a small area of the resonator length immediately in front of the two mirrors of the semiconductor laser diode at an incline to the main plane of the laser-active layer and by the v-groove-shaped recess being symmetrically shortened by the amount of this small area in relation to the resonator length.

15 Claims, 2 Drawing Sheets

HETEROSTRUCTURE SEMICONDUCTOR LASER DIODE

BACKGROUND OF THE INVENTION

The invention relates to a heterostructure semiconductor laser diode with a layer sequence formed on a substrate, wherein a laser-active layer is arranged between enclosing layers of respectively opposite conductivity types, wherein an additional layer and a cover layer of the same conductivity type as the substrate are formed on the side of the layer sequence facing away from the substrate, and wherein the cover layer includes an oppositely doped semiconductor area which penetrates the additional layer in a strip-shaped zone extending perpendicularly to the exit surface of the laser radiation in the area of the plane of symmetry below a v-groove-shaped recess and extends into the layer located thereunder, whereby the current flowing in the forward direction of the semiconductor laser diode is confined to a narrow, strip-shaped area of the laser-active layer.

A heterostructure semiconductor laser diode with a v-groove-shaped recess is known from German Pat. No. 2,822,146. A solution is proposed therein for improved adaptation of a semiconductor laser to, for example, an optical fiber provided for light conduction, in particular, a single-mode optical fiber where there is an essentially linear connection between light characteristic and current characteristic.

In these conventional semiconductor lasers, the active area or strip is pumped up to the resonator mirrors. The light in the laser-active layer exhibiting a constant band gap is, furthermore, conducted as far as the mirrors. Heat is generated at the mirrors by surface recombination, and the overpopulation in the valence or conduction band is simultaneously reduced. As a result, the directly generated heat together with the absorption induced by the absence of overpopulation cause a gradual degradation of the mirrors with relatively low output power and a strong degradation with high output power.

SUMMARY OF THE INVENTION

The object underlying the present invention is, therefore, to provide a structure for a semiconductor laser diode with which degradation of the mirrors is avoided.

This object is attained in accordance with the invention in that in a heterostructure semiconductor laser diode of the type initially described above, the oppositely doped semiconductor region extends into but does not penetrate the active layer; and the portion of the narrow, stripe-shaped area of the laser-active zone which is beneath the v-groove shaped recess, and hence relevant to the amplification, is significantly shorter in its length-wise dimensions than the resonator length of the semiconductor laser diode by the laser-active layer extending, in a small area of the resonator length immediately in front of the two mirrors of the semiconductor laser diode, at an incline to the main plane of the laser-active layer and the v-groove-shaped recess being symmetrically shortened by the amount of this small area in relation to the resonator length.

The inclination of the laser-active layer is of such configuration that the laser light is coupled out of the laser-active layer in the area of the inclination and continues in one of the two enclosing layers which do not absorb any laser light on account of their higher band gap. It is expedient for the offset of the laser-active layer in the area in front of the mirrors to be approximately 2 μm. The symmetrical shortening of the v-groove-shaped recess in relation to the resonator length is approximately 5 to 15 μm and is of the order of magnitude of two diffusion lengths of the charge carriers of the active layer. The fundamental advantage of the semiconductor laser structure according to the invention is that a laser with higher output power and simultaneously improved long-term stability is thereby attained.

Further advantageous embodiments of the invention are apparent from the subclaims.

Embodiments of the invention are illustrated in the drawings and will be described in greater detail hereinafter.

DESCRIPTION OF THE PREFERRED EMBODIMENTS

Figure 1:
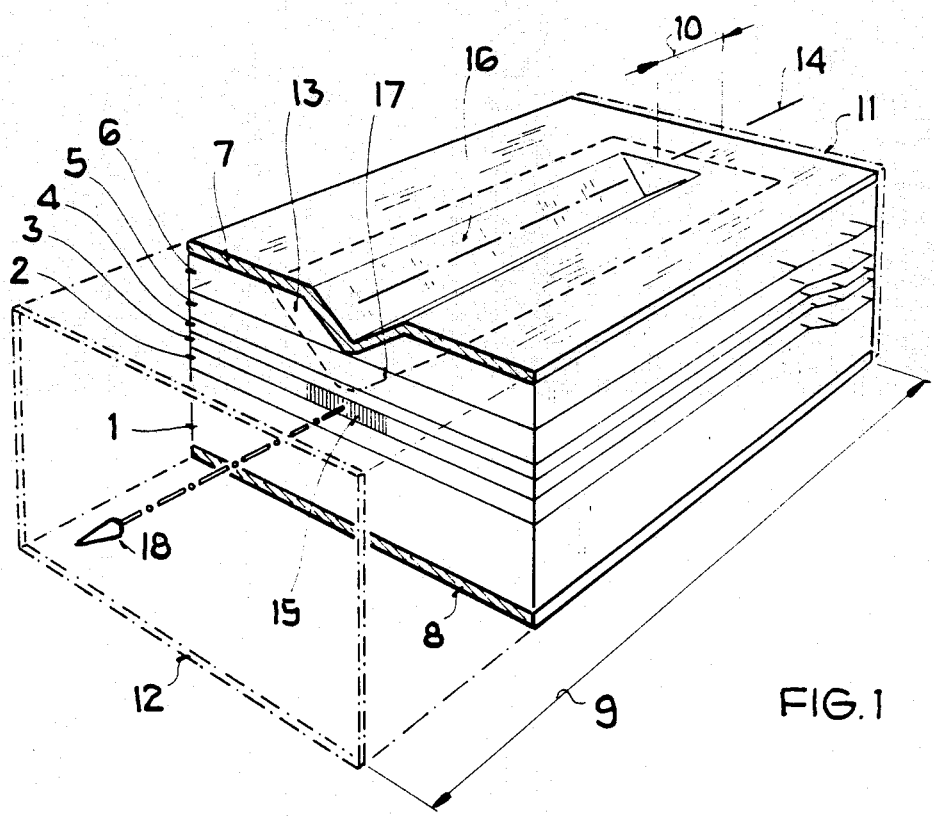
FIG. 1 shows a heterostructure semiconductor laser diode with a v-groove-shaped recess which is shortened in relation to the resonator length and an inclination of the laser-active layer in relation to its main plane in the area in front of the mirrors.

FIG. 1 shows a substrate 1 consisting, for example, of GaAs, on which a sequence layers 2 to 6 are grown, preferably by liquid-phase epitaxy, with the following compositions:

1. GaAs substrate, n-type, $n \sim 2 \cdot 10^{18}$ cm$^{-3}$ thickness approximately (100) μm, orientation (100)
2. $Ga_{1-x}Al_xAs$ layer, n-type, $n \sim 2 \cdot 10^{17}$ cm$^{-3}$, $d \sim 5$ μm;
3. $Ga_{1-y}Al_yAs$ layer, n-type, $n = 1 \ldots 8 \cdot 10^{18}$ cm$^{-3}$ or undoped, $d \sim 0.1$ μm;
4. $Ga_{1-x'}Al_{x'}As$ layer, p-type, $p \sim 2 \cdot 10^{17}$ cm$^{-3}$, $d \sim 3$ μm;
5. $Ga_{1-x''}Al_{x''}As$ layer, n-type, $n \sim 2.10^{17}$ cm$^{-3}$, $d \sim 1$ μm;
6. GaAs layer, n-type, $n \sim 5.10^{17}$ cm$^{-1}$, $d \sim 2$ μm.

Additionally shown are an ohmic contact 7 of TiPtAu for the cover layer 6 and an ohmic contact 8 of an Au-Ge alloy for the substrate 1.

In the chosen Example, x32 $x' = x'' = 0.35$ was selected.

The aluminum concentration and the stated doping values are merely typical values. The layer sequence 2 to 4 corresponds, together with the active layer 3, to the known double heterostructure in which the laser activity occurs upon current injection.

The inclination or offset of the laser-active layer 3 in relation to the main plane in the area in front of the resonator mirrors 11 and 12, with or without symmetrical shortening of the v-groove-shaped recess 16 relative to the resonator length 9 by the respective distances 10, is novel in this layer structure.

The laser beam 18 is coupled out of the laser-active layer 3 into one of the two enclosing layers 4 and 5, respectively, by the inclination or offset of the laser-active layer in relation to its main plane in the area in front of the mirrors 11 and 12 and penetrates the resonator mirrors in the area of one of the two enclosing layers.

The purpose served by the shortening of the v-groove-shaped recess 16 in the area in front of the mirrors 11 and 12 is the avoidance of unnecessary pumping work in the areas with an active layer located at a higher or lower level. The v-groove-shaped recess 16 is produced by a photoresist mask and etching in the area of the plane of the symmetry 14.

The mask for the exposure is adjusted on the (100) crystal surface so that the strips of the mask lie parallel to one (110) direction. This results in development of the etched flanks in the (111) crystal planes. In the subsequent diffusion, zinc, for example, is diffused into the entire surface, in accordance with a known process, from the top surface. On account of the structure of the top surface, a region 13 of a conductivity type opposite that of the substrate, P type in the example, and having the diffusion front 17 indicated in the drawings is obtained. It is expedient for the diffusion depth to be such that this front 17 just penetrates the additional layer 5 and extends into the layer 4 located thereunder.

Figure 2:
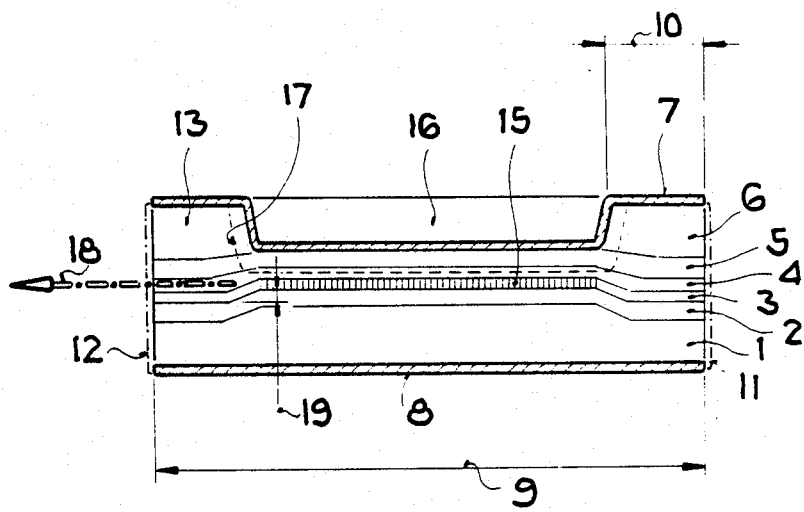
FIG. 2 shows a longitudinal section taken through the semiconductor laser diode of FIG. 1.
Figure 3:
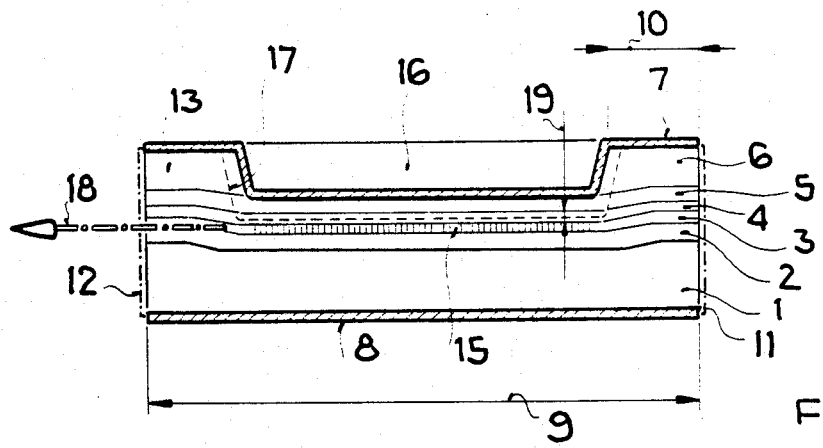
FIG. 3 shows a longitudinal section taken through a semiconductor laser diode wherein the offset of the laser-active layer in the area in front of the mirrors is in the form of an elevation.

The longitudinal sections shown in FIGS. 2 and 3 illustrate instances with a shortened v-shaped groove 16. In these instances, it is expedient for the diffusion to be limited to the area of the v-shaped groove, in order to avoid unnecessary pumping work. FIGS. 2 and 3 differ in their structural design only in the way in which the laser-active layer 3 is inclined or offset (19) in relation to its main plane in the area in front of the mirrors 11 and 12. It is lowered in FIG. 2 and raised in FIG. 3. The extent of the offset 19 of the active layer 3 is greater than the depth of penetration of the optical field into the enclosing layer 4 facing away from the substrate or the enclosing layer 2 facing the substrate. The angle of inclination of the active layer 3 with respect to its main plane to form the offset 19 is greater than 45 degrees.

Lowering and raising, respectively, can be effected by the substrate being etched away in areas intended for that purpose by a known etching process and by the subsequent layers being made to grow by epitaxial processes of the known suitable kinds.

What is claimed is:

1. In a heterostructure semiconductor laser diode having a layer sequence formed on a substrate of one conductivity type (1), with the sequence including a laser-active zone (3) disposed between upper and lower enclosing layers (2, 4) of respectively opposite conductivity types, an additional layer (5) of the same conductivity type as the substrate (1) disposed on said upper enclosing layer on the side of the layer sequence facing away from the substrate, and a cover layer of the same conductivity type as the substrate disposed on said additional layer, and with said cover layer (6) including an oppositely doped diffused semiconductor region (13) which, in a strip-shaped zone extending perpendicularly to the exit surface of the laser radiation (18) in the area of the plane of symmetry (14) of the layer sequence and below a v-groove-shaped recess (16) formed in said cover layer, penetrates said additional layer (5) and extends into the said upper enclosing layer (4) located thereunder, whereby current flowing in the forward direction of the semiconductor laser diode is confined to a narrow, stripe-shaped area (15) of the laser-active layer (3); the improvement wherein: said oppositely doped semiconductor region extends into said upper layer but does not penetrate said active layer; the portion of said narrow, stripe-shaped area of the laser-active zone (3) which is beneath said v-groove shaped recess, and hence relevant to the amplification is significantly shorter in its length-wise dimensions than the resonator length (9) of the semiconductor laser diode by the laser-active layer (3) extending, in a small area (10) of the resonator length (9) immediately in front of the two mirrors (11, 12) of the semiconductor laser diode, at an incline to the main plane of the laser-active layer (3) and by the v-groove-shaped recess (16) being symmetrically shortened by the amount of this small area (10) in relation to the resonator length (9).

2. Heterostructure semiconductor laser diode as defined in claim 1, said incline of the laser-active layer extends at an angle of more than 45 degrees relative to the main plane of this layer layer.

3. Heterostructure semiconductor laser diode as defined in claim 1, wherein the laser-active layer (3) is raised in the area (10) in front of the mirrors (11, 12) relative to the main plane of the laser-active layer (3) by said incline.

4. Heterostructure semiconductor laser diode as defined in claim 3, wherein the raising is greater than the depth of penetration of the optical field into the enclosing layer (4) facing away from the substrate.

5. Heterostructure semiconductor laser diode as defined in claim 1, wherein after the inclination of the laser-active layer (3), the laser-active layer again extends parallel to its main plane as far as the mirrors (11, 12).

6. Heterostructure semiconductor laser diode as defined in claim 1, wherein the substrate (1) is n-doped.

7. A heterostructure semiconductor laser diode as defined in claim 1 wherein the laser-active layer (3) is lowered in the area (10) in front of the mirrors (11, 12) relative to the main plane of the laser-active layer (3) by said incline.

8. An heterostructure semiconductor laser diode as defined in claim 3, wherein the lowering is greater than the depth of penetration of the optical field into the enclosing layer (2) facing the substrate.

9. A heterostructure semiconductor laser diode as defined in claim 1 wherein said active layer is of one conductivity type and is highly doped relative to said upper and lower enclosing layers.

10. A heterostructure semiconductor laser diode as defined in claim 9 wherein said substrate and said lower enclosing layer are n-doped.

11. A heterostructure semiconductor laser diode as defined in claim 9 wherein said lower enclosing layer is of the same conductivity type as said substrate.

12. A heterostructure semiconductor laser diode as defined in claim 11 wherein said active layer is of the same conductivity type as said lower enclosing layer.

13. A heterostructure semiconductor laser diode as defined in claim 1 wherein said active layer is undoped.

14. A heterostructure semiconductor laser diode as defined in claim 1 wherein said lower enclosing layer is of the same conductivity type as said substrate.

15. A heterostructure semiconductor laser diode as defined in claim 14 wherein said active layer is of the same conductivity type as said lower enclosing layer.

* * * * *